(12) United States Patent
Liu

(10) Patent No.: US 12,254,793 B2
(45) Date of Patent: Mar. 18, 2025

(54) FLEXIBLE LED ELECTRONIC SCREEN

(71) Applicant: Shenzhen TBD Optoelectronic Technology Co., Ltd., Shenzhen (CN)

(72) Inventor: Hui Liu, Shenzhen (CN)

(73) Assignee: Shenzhen TBD Optoelectronic Technology Co., Ltd., Shenzhen (CN)

( * ) Notice: Subject to any disclaimer, the term of this patent is extended or adjusted under 35 U.S.C. 154(b) by 273 days.

(21) Appl. No.: 18/088,875

(22) Filed: Dec. 27, 2022

(65) Prior Publication Data

US 2024/0087481 A1 Mar. 14, 2024

(30) Foreign Application Priority Data

Sep. 8, 2022 (CN) .......................... 202222396750.8

(51) Int. Cl.
*G09F 9/30* (2006.01)
*H05K 1/18* (2006.01)
*F21S 4/24* (2016.01)
*F21Y 105/16* (2016.01)

(52) U.S. Cl.
CPC ............. *G09F 9/301* (2013.01); *H05K 1/189* (2013.01); *F21S 4/24* (2016.01); *F21Y 2105/16* (2016.08)

(58) Field of Classification Search
CPC . G09F 9/301; H05K 1/189; F21S 4/24; F21Y 2105/16
See application file for complete search history.

(56) References Cited

U.S. PATENT DOCUMENTS

2015/0029229 A1* 1/2015 Voutsas ................. G06F 1/1647
345/1.3
2020/0109828 A1* 4/2020 Tolen ...................... F21V 29/83

FOREIGN PATENT DOCUMENTS

CN 214847522 U * 11/2021

OTHER PUBLICATIONS

Li et al., CN214847522U, machine translation, Nov. 2021 (Year: 2021).*

* cited by examiner

*Primary Examiner* — Tracie Y Green
(74) *Attorney, Agent, or Firm* — Bay State IP, LLC

(57) ABSTRACT

The present application provides a flexible LED electronic screen, relating to the technical field of LED screens. During practical applications, by employing an FPC flexible circuit board and upper and lower shells made of PU or PVC materials, the present application prepares an LED electronic screen which can be bended and folded arbitrarily. An interface circuit arranged at two ends of the FPC flexible circuit board is used for splicing of an LED electronic screen, and users may perform splicing as needed, without limitation on length. In addition, the flexible LED electronic screen prepared according to the present application is easy to paste and move, with a wide field of application.

7 Claims, 4 Drawing Sheets

FLEXIBLE LED ELECTRONIC SCREEN

CROSS REFERENCE TO RELATED APPLICATION

This application claims the benefit of and takes priority from Chinese Patent Application No. 202222396750.8 filed on Sep. 8, 2022, the contents of which are herein incorporated by reference.

TECHNICAL FIELD

The present application relates to the technical field of LED screens, more particularly to a flexible LED electronic screen.

BACKGROUND

LED screen is a display screen that displays texts, patterns, images, animations and other information by turning on and off LED. With the maturity and popularization of LED technologies, the LED screen is used more and more widely. However, currently available LED display screens cannot be folded. Generally, they are directly transported or stored as a whole piece when being moved or stored, resulting in much inconvenience. Currently available LED display screens are of a fixed length and thus cannot be extended in length as needed, resulting in poor universality, incapability of splicing and movement, and inconvenience to use.

SUMMARY

To overcome the problems in the existing technologies at least to certain extent, the present application provides a flexible LED electronic screen, which can resolve the technical problems in the existing technologies that the LED screen is of a fixed length, is unable to be spliced and moved and is inconvenient in usage.

In order to achieve the above aim, the present application employs the following technical scheme.

The present application provides a flexible LED electronic screen, including:
  an upper shell, a lower shell, an FPC flexible circuit board and a power line; wherein
  the upper shell defines a plurality of square holes for exposing LED beads, protecting a LED lamp and preventing light spreading;
  the FPC flexible circuit board is provided with the LED lamp, a Bluetooth module and a WiFi module, and two ends of the FPC flexible circuit board are provided with an interface circuit for splicing of an LED screen;
  the lower shell is provided with an adhesive area on the periphery of a surface on which the FPC flexible circuit board is placed, for adhesion with the upper shell; and
  one end of the power line is electrically connected to the FPC flexible circuit board and the other end is a USB interface for connection to a power supply.

Further, the upper shell is also provided with an adhesive aera on the periphery of a surface contacting the FPC flexible circuit board, for adhesion with the lower shell to fix the FPC flexible circuit board.

Further, the upper shell and the lower shell are made of PU, PVC or silicone materials.

Further, two ends of the FPC flexible circuit board are provided with an interface circuit for splicing of an LED screen, and the splicing manner is welding.

Further, the FPC flexible circuit board is provided with the LED lamp, a Bluetooth module and a WiFi module, of which the Bluetooth module is configured to be connected to a mobile terminal or a vehicle Bluetooth, and the WiFi module is configured to be connected to a mobile network.

Further, the LED electronic screen after adhesion also needs to be stitched on the periphery with a thread for reinforcement.

Further, the flexible LED electronic screen may be fixed onto glass, a wall or other positions with double-side tape.

Employing the above technical scheme, the present application at least has the following beneficial effects.

During practical applications, by employing an FPC flexible circuit board and upper and lower shells made of PU or PVC materials, the present application prepares an LED electronic screen which can be bended and folded arbitrarily. An interface circuit arranged at two ends of the FPC flexible circuit board is used for splicing of an LED electronic screen, and users may perform splicing as needed, without limitation on length. In addition, the flexible LED electronic screen prepared according to the present application is easy to paste and move, with a wide field of application.

It should be understood that the above general description and the hereinafter detailed description are merely exemplary and explanatory and hence cannot be constructed as limitation on this application.

BRIEF DESCRIPTION OF THE DRAWINGS

For a better understanding of the technical scheme in the embodiments of the present application, accompanying drawings needed in the description of the embodiments are simply illustrated below. Obviously, the accompanying drawings described below are merely part embodiments of the present application. For the ordinary skill in the field, other accompanying drawings may be obtained according to these accompanying drawings without creative work.

DETAILED DESCRIPTION OF THE EMBODIMENTS

Figure 1:
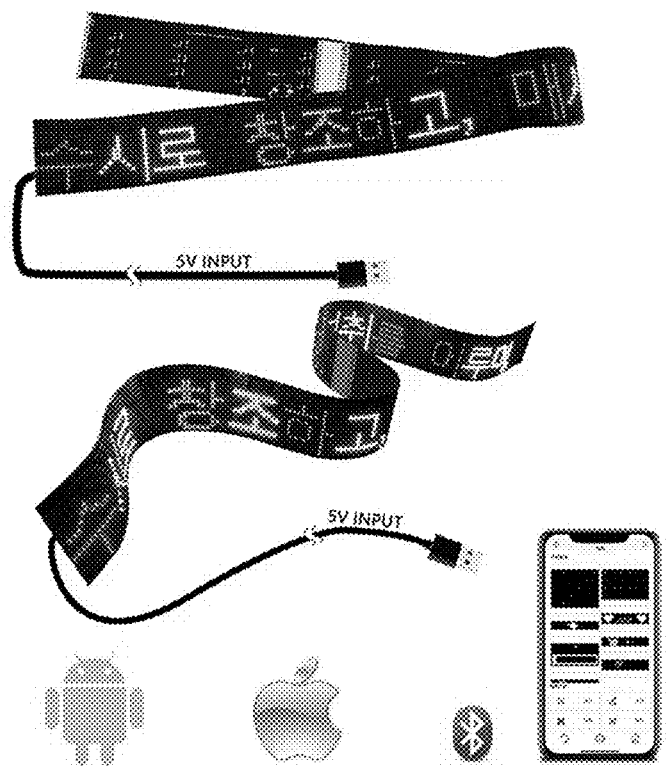
FIG. 1 is a diagram of a flexible LED electronic screen product according to one exemplary embodiment.
Figure 2:
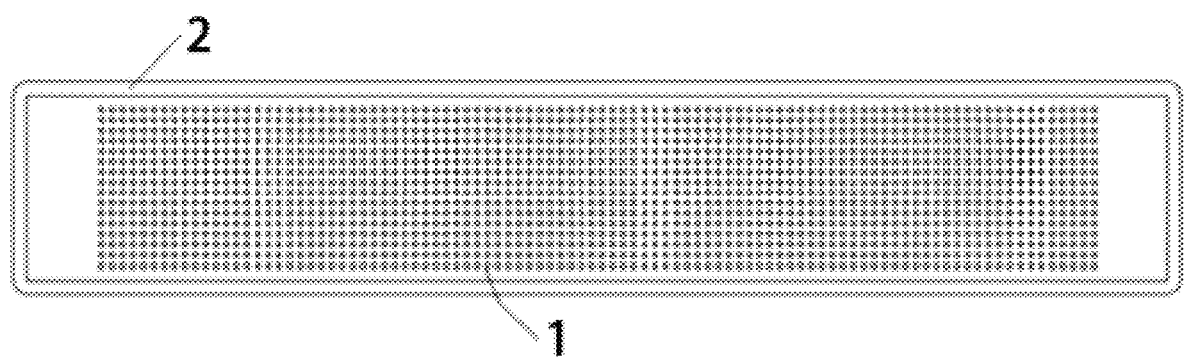
FIG. 2 is a diagram of a surface of an upper shell of a flexible LED electronic screen according to one exemplary embodiment.
Figure 3:
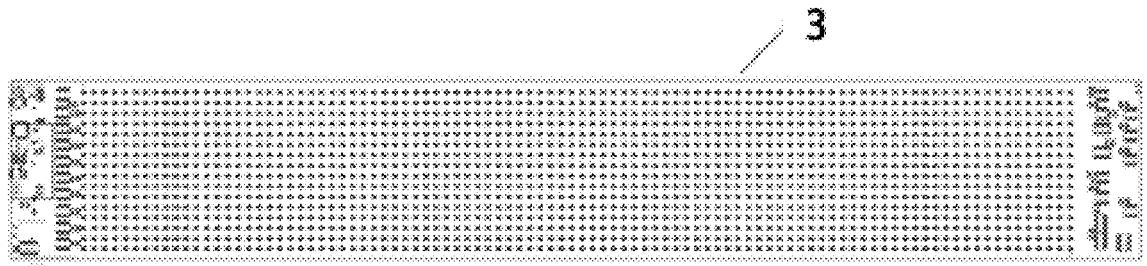
FIG. 3 is a diagram of an FPC flexible circuit board of a flexible LED electronic screen according to one exemplary embodiment.
Figure 4:
FIG. 4 is a diagram of a surface of a lower shell of a flexible LED electronic screen according to one exemplary embodiment.
Figure 5:
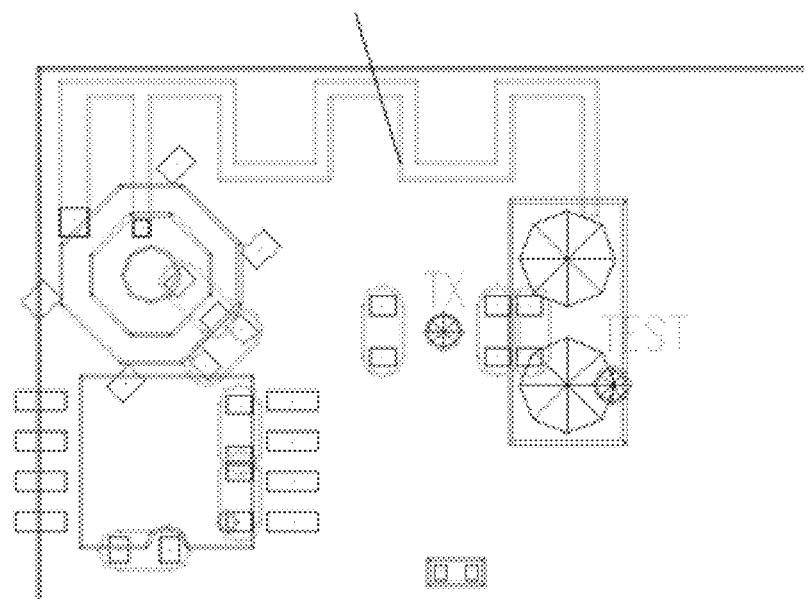
FIG. 5 is a partial diagram of an FPC flexible circuit board of a flexible LED electronic screen according to one exemplary embodiment.

To make the purpose, the technical scheme and the advantages of this application apparent and understandable, a detailed description is provided below for the technical scheme of this application. Obviously, the embodiments described hereinafter are simply part embodiments of this application, but all the embodiments. All other embodiments obtained by those skilled in the art based on the embodiments in this application without creative work are intended to be included in the scope of protection of this application.

Referring to FIG. 2 to FIG. 5, a flexible LED electronic screen includes an upper shell, a lower shell, an FPC flexible circuit board and a power line; wherein the upper shell defines a plurality of square holes 1 and is provided with an adhesive area 2 in a circle on the backside, the FPC flexible circuit board 3 is provided with a plurality of LED lamps and two ends thereof are provided with an interface circuit, a Bluetooth module and a WiFi module are provided on the same surface as the LED lamp on the FPC flexible circuit board 3, a surface of the lower shell is also provided with an adhesive area 2 which is at the same position as the adhesive area 2 on the surface of the upper shell and is used for gluing the FPC flexible circuit board up and down to protect the circuit board and the LED beads. The above square holes 1 are 2.4×2.4 mm in size. The square holes Tare used for exposing the LED lamp, thereby protecting the lamp beads, focusing the light source, and preventing spreading of light source.

In one embodiment, the upper shell and the lower shell are made of PU, PVC or silicone materials. Specifically, the upper shell and the lower shell are made of materials such as PU, PVC or silicone, to ease the folding and bending of the LED electronic screen; in addition, such kind of materials are light in weight, reasonable in cost, featured with waterproofing and are convenient for users to use.

In one embodiment, two ends of the FPC flexible circuit board are provided with an interface circuit for splicing of an LED screen, and the splicing manner is welding. Specifically, the above interface circuit may connect an LED screen through a welding manner according to the length required by the user, which is easy and quick and may be applied to different scenarios.

In one embodiment, the FPC flexible circuit board is provided with the LED lamp, a Bluetooth module and a WiFi module, of which the Bluetooth module is configured to be connected to a mobile terminal or a vehicle Bluetooth, and the WiFi module is configured to be connected to a mobile network. Specifically, the Bluetooth module may be connected to a vehicle Bluetooth, also may be connected to a phone Bluetooth or the Bluetooth of other mobile terminals, the WiFi module may be connected to a mobile or fixed wireless network; after connection, the flexible LED electronic screen may be controlled by a mobile phone or other terminals, so that the texts or patterns shown on the LED screen can be modified.

Referring to FIG. 1, which is a diagram of a flexible LED electronic screen product according to another exemplary embodiment, the present application may be connected to the Andrew or IOS system either through Bluetooth or through WiFi. The mobile terminal may be a cell phone or a tablet computer, which controls the texts to be output onto the screen. The present application can be made as an electronic car sticker, a mobile billboard, etc.

In one embodiment, the LED electronic screen after adhesion also needs to be stitched on the periphery with a thread for reinforcement. Specifically, after the upper shell and the lower shell are bonded, the periphery of the LED electronic screen is further stitched with a thread in a circle for reinforcement, preventing the adhesive area cracking.

According to the technical scheme of the present application, by employing an FPC flexible circuit board and upper and lower shells made of PU or PVC materials, an LED electronic screen is prepared which can be bended and folded arbitrarily. An interface circuit arranged at two ends of the FPC flexible circuit board is used for splicing of an LED electronic screen, and users may perform splicing as needed, without limitation on length. In addition, the flexible LED electronic screen prepared according to the present application is easy to paste and move, with a wide field of application.

It is understandable that the same or similar parts in each above embodiment can refer to each other; those contents not described in detail in some embodiments can refer to the same or similar contents in other embodiments.

It should be noted that, in the description of the present application, terms such as "first", "second", etc. are merely for the purpose of description, but cannot be understood as the indication or implication of relative importance. In addition, in the description of this application, unless otherwise stated, "a plurality of" and "many" means at least two.

It is to be noted that when an element is described as "fixed on" or "arranged on" another element, it may be directly on the another element, or there might be an intermediate element between them. When one element is described as "connected to" another element, it may be directly connected to the another element, or there might be an intermediate elements between them. In addition, the "connection" used here may include wireless connection; terms "and/or" used here include any and all combinations of one or more listed items.

Flowcharts or any process described herein in other manners or method descriptions may be understood as representing a module, a fragment or a part of the codes including one or more executable instructions used for implementing steps of a particular logic function or process; further, the scope of the preferred embodiments of this application includes additional implementations which may not be in the indicated or discussed order, including executing the functions in a substantially simultaneous manner or in reverse order, depending on the functions involved, and this shall be understood by those skilled in the field to which the embodiments of this application belongs.

It should be understood that each part of the present application may be implemented through hardware, software, firmware or combinations thereof. In the above embodiments, multiple steps or methods may be implemented through software or firmware stored in a memory and executed by proper instruction or systems. For example, if implemented through hardware, like in another embodiment, they may be implemented through any one of the following known technologies in the art or a combination thereof: discrete logic circuits with logic gate circuits for realizing logic function on data signal, special integrated circuits with appropriate combined logic gate circuits, Programmable Gate Array (PGA), Field Programmable Gate Array (FPGA), etc.

The ordinary staff in this field can understand that all or part steps carried in the above method embodiments may be implemented through a program instructing related hardware, the program may be stored in a computer readable storage medium, and when being executed, includes one of the steps in the method embodiment or a combination thereof.

In addition, each function unit in each embodiment of the present application may be integrated in one processing module, or each unit may exist physically and separately, or two or more units are integrated in one module. The above integrated modules may be realized in the form of hardware, or in the form of a software function module. The integrated module may also be stored in a computer-readable storage medium if implemented in the form of a software function module and sold or used as an independent product.

The above mentioned storage medium may be a read-only memory, a disk or a compact disc, etc.

In the description of the specification, terms such as "one embodiment", "some embodiment", "example", "specific example", or "some examples" mean that the specific features, structures, materials, or features described in combination with the embodiment or example are included in at least one embodiment or example of the present application. In the specification, indicative expressions of the above terms do not necessarily refer to the same embodiments or examples. Moreover, the specific features, structures, materials or features described may be combined in an appropriate manner in any one or more embodiments or examples.

Although the above has shown and described the embodiments of the present application, it is understandable that the above embodiments are exemplary and cannot not be viewed as restrictions to the present application. The ordinary skill in the art can perform modifications, changes, substitutions and transformations on the above embodiments within the scope of the present application.

What is claimed is:

1. A flexible LED electronic screen, comprising an upper shell, a lower shell, an FPC flexible circuit board and a power line; wherein
    the upper shell defines a plurality of square holes for exposing LED beads, protecting a LED lamp and preventing light spreading;
    the FPC flexible circuit board is provided with the LED lamp, a Bluetooth module and a WiFi module, and two ends of the FPC flexible circuit board are provided with an interface circuit for splicing of an LED screen;
    the lower shell is provided with an adhesive area on the periphery of a surface on which the FPC flexible circuit board is placed, for adhesion with the upper shell; and
    one end of the power line is electrically connected to the FPC flexible circuit board and the other end is a USB interface for connection to a power supply.

2. The flexible LED electronic screen according to claim 1, wherein the upper shell is also provided with an adhesive area on the periphery of a surface contacting the FPC flexible circuit board, for adhesion with the lower shell to fix the FPC flexible circuit board.

3. The flexible LED electronic screen according to claim 2, wherein the upper shell and the lower shell are made of PU, PVC or silicone materials.

4. The flexible LED electronic screen according to claim 3, wherein two ends of the FPC flexible circuit board are provided with an interface circuit for splicing of an LED screen, and the splicing manner is welding.

5. The flexible LED electronic screen according to claim 4, wherein the FPC flexible circuit board is provided with the LED lamp, a Bluetooth module and a WiFi module, of which the Bluetooth module is configured to be connected to a mobile terminal or a vehicle Bluetooth, and the WiFi module is configured to be connected to a mobile network.

6. The flexible LED electronic screen according to claim 5, wherein the LED electronic screen after adhesion also needs to be stitched on the periphery with a thread for reinforcement.

7. The flexible LED electronic screen according to claim 6, wherein the flexible LED electronic screen may be fixed onto glass, a wall or other positions with double-side tape.

* * * * *